(12) United States Patent
Huang et al.

(10) Patent No.: US 10,651,066 B2
(45) Date of Patent: May 12, 2020

(54) METROLOGY METHOD IN WAFER TRANSPORTATION

(71) Applicant: Taiwan Semiconductor Manufacturing Co., Ltd., Hsinchu (TW)

(72) Inventors: Powen Huang, Taichung (TW); Yao-Yuan Shang, Taichung (TW); Kuo-Shu Tseng, New Taipei (TW); Yen-Yu Chen, Taichung (TW); Chun-Chih Lin, Taipei (TW); Yi-Ming Dai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 37 days.

(21) Appl. No.: 15/879,651

(22) Filed: Jan. 25, 2018

(65) Prior Publication Data

US 2019/0164792 A1    May 30, 2019

Related U.S. Application Data

(60) Provisional application No. 62/590,405, filed on Nov. 24, 2017.

(51) Int. Cl.
*H01L 21/67* (2006.01)
*H01L 21/677* (2006.01)
*H01L 21/673* (2006.01)
*H01L 21/02* (2006.01)
*G01D 7/00* (2006.01)
*G01D 5/00* (2006.01)
*B08B 3/04* (2006.01)

(52) U.S. Cl.
CPC ........ *H01L 21/67276* (2013.01); *G01D 5/00* (2013.01); *G01D 7/00* (2013.01); *H01L 21/02079* (2013.01); *H01L 21/6773* (2013.01); *H01L 21/67288* (2013.01); *H01L 21/67389* (2013.01); *H01L 21/67393* (2013.01); *H01L 21/67733* (2013.01); *H01L 21/67778* (2013.01); *B08B 3/04* (2013.01)

(58) Field of Classification Search
None
See application file for complete search history.

(56) References Cited

U.S. PATENT DOCUMENTS

| | | | | |
|---|---|---|---|---|
| 2003/0110649 A1* | 6/2003 | Hudgens | ........... | H01L 21/67259 33/286 |
| 2008/0243294 A1* | 10/2008 | Winkler | ........... | G05B 19/41875 700/121 |
| 2014/0200702 A1* | 7/2014 | Liu | ........... | G01N 29/14 700/112 |
| 2017/0313520 A1* | 11/2017 | Tsai | ........... | B65G 17/485 |

* cited by examiner

*Primary Examiner* — Jason Lin
(74) *Attorney, Agent, or Firm* — McClure, Qualey & Rodack, LLP

(57) ABSTRACT

A method for fault detection in a fabrication facility is provided. The method includes moving a wafer carrier using a transportation apparatus. The method further includes measuring an environmental condition within the wafer carrier or around the wafer carrier using a metrology tool positioned on the wafer carrier during the movement of the wafer carrier. The method also includes issuing a warning when the detected environmental condition is outside a range of acceptable values.

20 Claims, 11 Drawing Sheets

METROLOGY METHOD IN WAFER TRANSPORTATION

PRIORITY CLAIM AND CROSS-REFERENCE

This application claims the benefit of U.S. Provisional Application No. 62/590,405, filed on Nov. 24, 2017, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

ICs are typically fabricated by processing one or more wafers as a "lot" with using a series of wafer fabrication tools (i.e., "processing tools"). Each processing tool typically performs a single wafer fabrication process on the wafers in a given lot. For example, a particular processing tool may perform layering, patterning and doping operations or thermal treatment. A layering operation typically adds a layer of a desired material to an exposed wafer surface. A patterning operation typically removes selected portions of one or more layers formed by layering. A doping operation typically incorporates dopants directly into the silicon through the wafer surface, to produce p-n junctions. A thermal treatment typically heats a wafer to achieve specific results (e.g., dopant drive-in or annealing). As a result, there is a need for transporting the wafer in the factory.

Although numerous improvements to the methods of transporting wafer have been invented, they have not been entirely satisfactory in all respects. Consequently, it would be desirable to provide a solution to improve the transportation system so as to mitigate or avoid the production of excess scrap wafer due to improper storage conditions for the wafer during its transportation.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
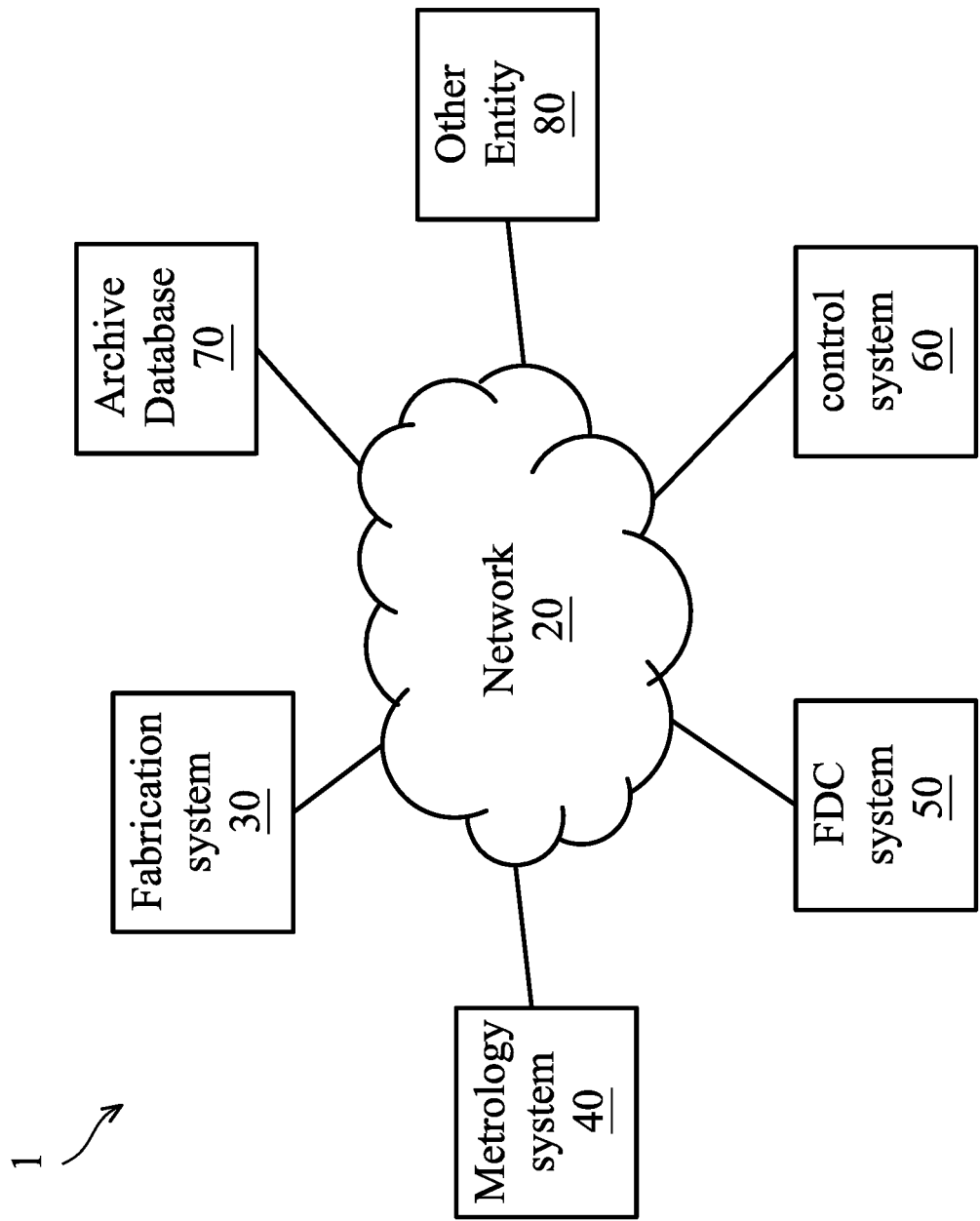
FIG. 1 is a block diagram of a fabrication facility, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIG. 1 is a block diagram of a fabrication facility 1 according to various aspects of the present disclosure. The fabrication facility 1 implements integrated circuit manufacturing processes to fabricate integrated circuit devices. For example, the fabrication facility 1 may implement semiconductor manufacturing processes that fabricate semiconductor wafers. It should be noted that, in FIG. 1, the fabrication facility 1 has been simplified for the sake of clarity to better understand the inventive concepts of the present disclosure. Additional features can be added in the fabrication facility 1, and some of the features described below can be replaced or eliminated in other embodiments of the fabrication facility 1. The fabrication facility 1 may include more than one of each of the entities in the depicted embodiment, and may further include other entities not illustrated in the depicted embodiment.

In some embodiments, the fabrication facility 1 includes a network 20 that enables various entities (a fabrication system 30, a metrology system 40, a fault detection and classification (FDC) system 50, a control system 60, an archive database 70, and another entity 80) to communicate with one another. The network 20 may be a single network or a variety of different networks, such as an intranet, the Internet, another network, or a combination thereof. The network 20 may include wired communication channels, wireless communication channels, or a combination thereof.

Figure 2:
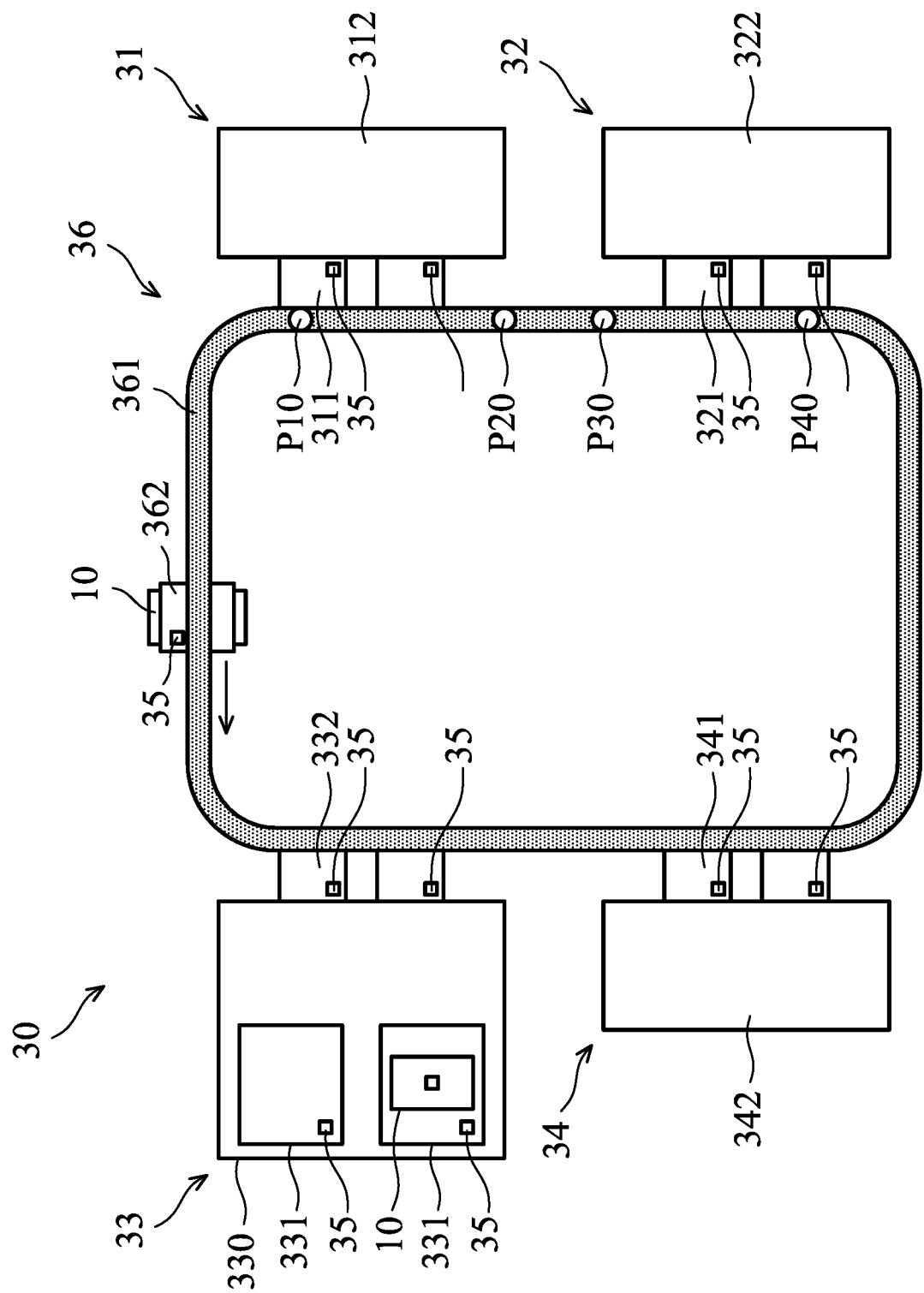
FIG. 2 is a schematic view of partial elements of the fabrication facility, in accordance with some embodiments.

FIG. 2 is a schematic view of partial elements of the fabrication facility 1, in accordance with some embodiments. In some embodiments, the fabrication system 30 includes a number of processing tools, such as a first processing tool 31 and a second processing tool 32, a stocker 33, a rework station 34, a number of interface devices 35, and a transportation apparatus 36.

The first processing tool 31 and the second processing tool 32 are configured to perform a wafer fabrication process. The first processing tool 31 and the second processing tool 32 may include any type of wafer processing tools used in semiconductor chip fabrication. In some embodiments, the first processing tool 31 is a deposition tool for forming a material layer over a wafer (not shown in FIG. 2), and the second processing tool 32 is a lithography tool for performing a lithography process over the material layer formed on the wafer. Alternatively, the first processing tool 31 and the second processing tool 32 may include metrology, inspection, testing or other tool.

In some embodiments, the first processing tool 31 includes one or more load ports 311, and the second processing tool 32 includes one or more load ports 321. The load ports 311 and 321 are configured to support and dock the wafer carriers 10 for facilitating the insertion of wafer carriers 10 into, and their subsequent removal from, processing chambers 312 and 322 of the first processing tool 31 and the second processing tool 32.

The stocker 33 is configured to automation storage and retrieval of the wafer carrier 10. In some embodiments, the stocker 33 includes a main body 330, a number of storage shelves 331 and a number of load ports 332. In some embodiments, the main body 330 is a rectangular enclosure. The storage shelves 331 are positioned inside the main body 330 and configured to facilitate the storage of the wafer carriers 10 within the main body 330. The wafer carrier 10 may be transferred by a robotic arm (not shown in figures), and the transportation or the movement of the wafer carrier 10 in the stocker 33 is controlled by the control system 60. The load port 332 is configured to support and dock the wafer carriers 10 for facilitating the insertion of wafer carriers 10 into, and their subsequent removal from, the main body 330 of the stocker 33. The load port 332 is positioned along the trail assembly 361 of the transportation apparatus 36 so as to receive the wafer carriers 10 transferred from the vehicle of the transportation apparatus 36.

The rework station 34 is configured to perform a rework process to the wafer (not shown in FIG. 2) which has been processed by the first processing tool 31 or the second processing tool 32. In some embodiments, the rework station 34 includes a cleaning tool. The wafer in the rework station 34 may be cleaned with a cleaning liquid, and a material layer, such as photo resistor, is removed from the wafer. In some other embodiments, the rework station 34 includes an etching tool. The wafer in the rework station 34 may undergo plasma, and a material layer, such as metal layer, is removed from the wafer. In some embodiments, the rework station 34 includes one or more load ports 341 configured to support and dock the wafer carriers 10 for facilitating the insertion of wafer carriers 10 into, and their subsequent removal from, the processing chamber 342 of the rework station 34.

The transportation apparatus 36 is configured to transport or convey the wafer carrier 10 to and from different locations in the fabrication system 30. The transportation apparatus 36 includes a trail assembly 361 and a number of overhead hoist transport (OHT) assemblies 362, in accordance with some embodiments. The trail assembly 361 is mounted on the ceiling of a FAB, for example. The OHT assembly 362 is suspended by the trail assembly 361, and the transportation or the movement of the OHT assembly 362 on the trail assembly 361 is controlled by the control system 60. The OHT assembly 362 is operable to raise and lower the wafer carriers, thereby allowing the wafer carriers 10 from the load ports 311, 321, 332, and 341 positioned along and on the floor beneath the trail assembly 361.

The interface devices 35 are positioned in multiple positions of the fabrication system 30 where the wafer carrier 10 may be placed. For example, each of the load ports 311 of the first processing tool 31 has an interface device 35 mounted inside. In addition, each of the load ports 332 and each of the shelves 331 of the stocker 33 has an interface device 35 mounted inside. Moreover, each of the OHT assemblies 362 has an interface device 35 mounted inside. Elements of the interface device 35 will be described in more detail later with reference to FIG. 5.

Figure 3:
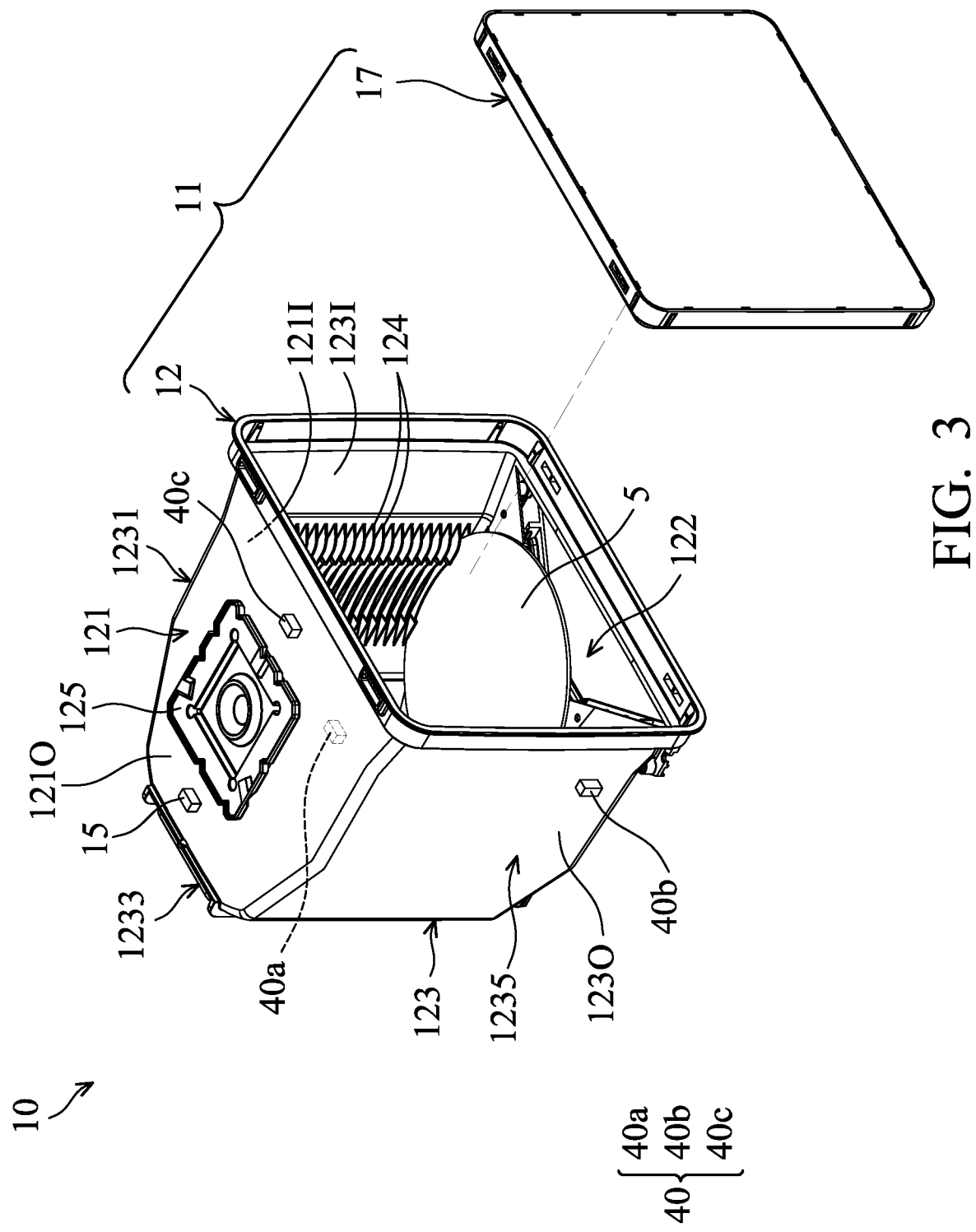
FIG. 3 is a schematic view of a wafer carrier, in accordance with some embodiments.

FIG. 3 shows a schematic view of a wafer carrier 10, in accordance with some embodiments. The wafer carrier 10 is configured to transport a number of semiconductor wafers, e.g., 6 wafers, 12 wafers, 24 wafers, etc. The wafer carrier 10 may be standard mechanical interfaces (SMIFs) for loading semiconductor wafers each having a diameter of 200 mm. Alternatively the wafer carrier 10 may be front opening unified pods (FOUPs), which may be used to load 300 mm or 450 mm semiconductor wafers, or semiconductor wafers with larger diameters. Other types and/or sizes of wafer carrier or pod are, however, not excluded.

In some embodiments, each of the wafer carriers 10 includes a housing 11 for containing a number of wafers 5 (only one wafer 5 is shown in FIG. 3). The housing 11 includes a container 12 and a door 17, in accordance with some embodiments. The container 12 may be opened when the door 17 is disengaged from the container 12. Alternatively, the container 12 may be closed when the door 17 is engaged with the container 12.

The container 12 has an upper wall 121, a lower wall 122, and a side wall unit 123. The upper wall 121 is opposite to the lower wall 122. The side wall unit 123 includes a numbers of panels connected between the upper wall 121 and the lower wall 122. In some embodiments, the side wall unit 123 includes three panels 1231, 1233, and 1235. The three panels 1231, 1233, and 1235 are consecutively connected between the upper wall 121 and the lower wall 122.

The door 17 is selectively engaged with the container 12. When the door 17 is engaged with the container 12, the door 17 is held by the upper wall 121 and the lower wall 122, and the panels 1231 and 1235, cooperatively. As a result, an enclosure 110 of the wafer carrier 10 is formed inside of the housing 11. The wafers 5 are loaded into an enclosure 110 of the wafer carrier 10 or unloaded from the enclosure 110 of the wafer carrier 10 when the door 17 is disengaged from the container 12.

In some embodiments, each of the wafer carriers 10 further includes multiple supporting members 124 for supporting the semiconductor wafers 120. The supporting members 124 are located inside of the enclosure 110, and the supporting members 124 are fixed at the side wall unit 123 of the container 12. In some embodiments, the supporting members 124 respectively extend along a direction parallel to the upper wall 121 and the lower wall 122. Therefore, the wafers 5 supported by the supporting members 124 are parallel to the upper wall 121 and the lower wall 122.

In some embodiments, each of the wafer carriers 10 further includes a plate member 125. The plate member 125 is disposed on the upper wall 121 of the housing 11. The plate member 125 is configured for being gripped by a gripper (not shown) of the OHT assembly 362 (FIG. 2).

The metrology system 40 is configured to detect one or more environmental conditions in the wafer carrier 10 or detect one or more environmental conditions around the wafer carrier 10 and/or detect a leveling degree of the wafer carrier 10. Examples of the detected environmental conditions include temperature, humidity, air pressure, the level of particle concentration, the level of gas concentration, and/or the level of metal ion concentration.

In some embodiments, the metrology system 40 includes a number of metrology tools 40a, 40b and 40c. The metrology tool 40a is positioned on an inner surface 1211 of the upper wall 121 and is configured to detect environmental conditions in the enclosure 110 of the wafer carrier 10. The metrology tool 40b is positioned on an outer surface 123O of the side wall unit 123 (such as outer surface of the panel 1235) and is configured to detect environmental conditions around the wafer carrier 10. The metrology tool 40c is positioned on an outer surface 121O of the upper wall 121 and is configured to detect environmental conditions around the wafer carrier 10 and/or a leveling degree of the wafer carrier 10. It should be appreciated that the number and the location of the metrology tools 40a, 40b and 40c should not be limited to the embodiment shown in FIG. 3 and can be varied according to demands.

Figure 4:
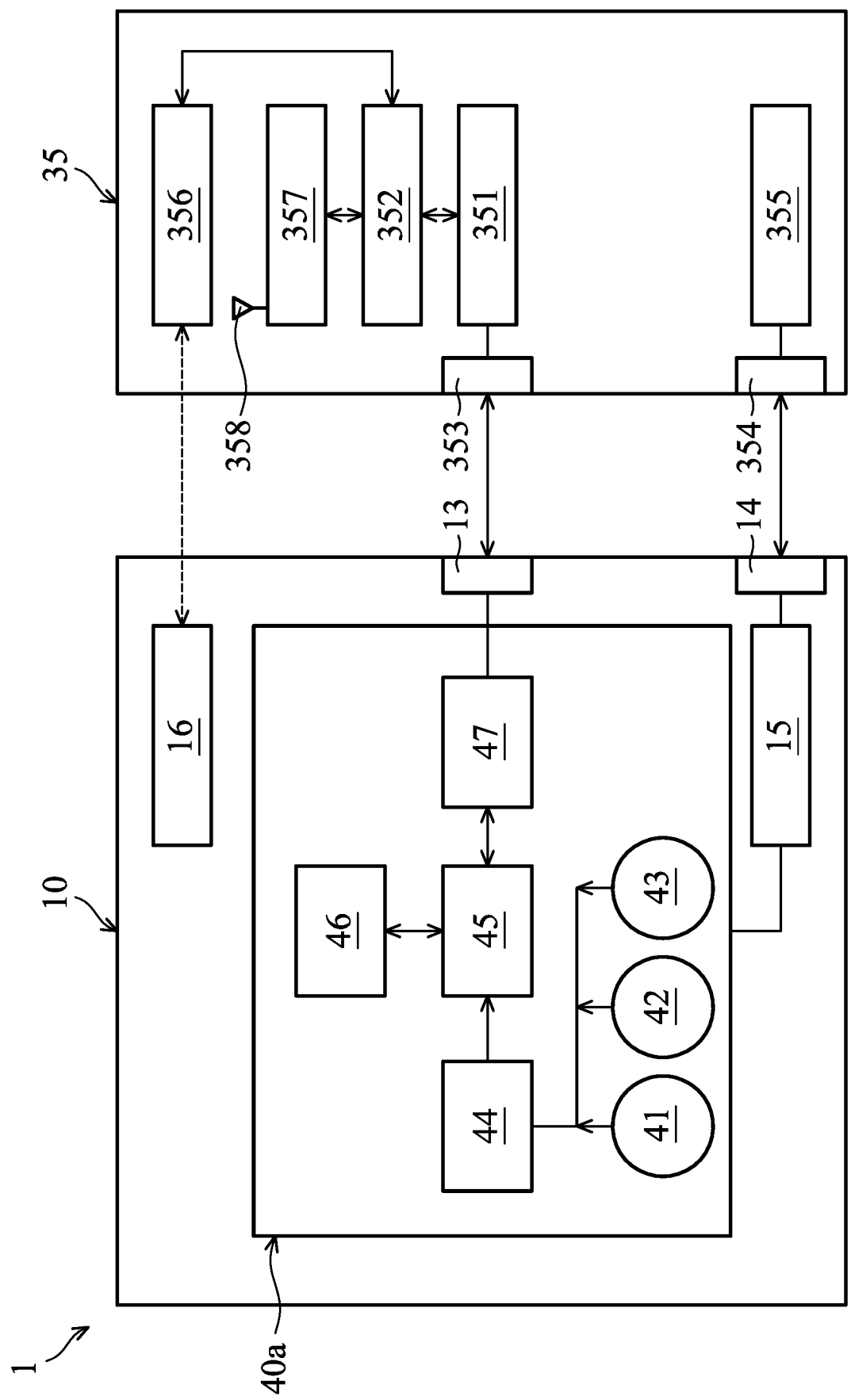
FIG. 4 is a block diagram of partial elements of the fabrication facility, in accordance with some embodiments.

FIG. 4 shows a block diagram of partial elements of the fabrication facility 1, in accordance with some embodiments. While the embodiments of FIG. 4 use the metrology tool 40a as an example, the metrology tool 40b and 40c can be configured to have a configuration that is the same or similar.

In some embodiments, the metrology tool 40a includes one or more sensors, such as sensors 41 and 42. Each of the sensors 41 and 42 is configured to detect one of the environmental conditions. The multiple sensors 41 and 42 allow different types of data associated with environmental conditions to be collected simultaneously. Alternatively, each of the sensors 41 and 42 is configured to detect more than one of the environmental conditions in the wafer carrier 10. In some embodiments, the metrology tool 40a further includes a leveling sensor 43. The leveling sensor 43 is configured to detect a leveling degree of the wafer carrier 10.

In some embodiments, the metrology tool 40a also includes a signal converter 44, a processor 45, a storage device 46 and an input and output (I/O) controller 47. The signal converter 44 receives the output of the sensors 41, 42 and 43 as input. The signal converter 44 includes a multi-channel analog-to-digital converter in the present embodiment, and each channel is capable of converting the analog signal output from one of the sensors 41, 42 and 43 into digital form. In alternative embodiments where the sensors 41, 42 and 43 output digital signals, the signal converter 44 may perform the necessary data processing on the digital signal outputs of the sensors 41, 42 and 43.

The signal converter 44 then outputs the data associated with environmental conditions to an input of the processor 45, which performs further processing on the data. In an embodiment, the processor 45 controls the operations of the signal converter 44 and the I/O controller 47. In yet another embodiment, the signal converter 44 is integrated into the processor 45.

The processor 45 can communicate with the storage device 46. For example, data associated with environmental conditions can be transferred between the storage device 46 and the processor 45 to enhance the functionality of the processor 45. The storage device 46 may be any form of memory, including Flash, Memory Stick, Micro-SD, or a hard disk. In yet another alternative embodiment, the storage device 46 may be integrated into the processor 45. In some embodiments, the storage device 46 is separated from the metrology tool 40a and is independently positioned on the plate member 125 for easily access the information by the interface device 35 positioned in the OHT assemblies 362.

The I/O controller 47 is operatively coupled to the processor 45. The I/O controller 47 may be integrated with the processor 45 or it may be a separate component as shown. The I/O controller 47 is generally configured to control interactions with one or more interface devices 35 that can be coupled to the wafer carrier 10. The I/O controller 47 generally operates by exchanging data between the metrology tool 40a and the interface devices 35 that desire to communicate with the metrology tool 40a. In some cases, the interface devices 35 may be connected to the I/O controller 47 through wired connections and in other cases the interface devices 35 may be connected to the I/O controller 47 through wireless connections, such as WIFI, 3G, 4G, LTE, 5G, or bluetooth.

In the illustrated embodiment, the interface device 35 is capable of being connected to the I/O controller 47 through a wired connection. In this case, the wafer carrier 10 includes a data connector 13 coupled to the I/O controller 47. The data connector 13 is capable of connecting to a corresponding a data connector 353 and a transceiver 351 located within the interface device 35, and the data connector 13 is configured to engage the data connector 353 so as to provide data transmissions to and from the metrology tool 40a.

The wafer carrier 10 also includes a power connector 14. The power connector 14 of the wafer carrier 10 is operatively coupled to a battery 15 of the wafer carrier 10. The power connector 14 is configured to engage a power connector 354 and a power circuit 355 of the interface device 35 so as to provide operational or charging power to the battery 15. The battery 15 may be positioned on the outer surface 121O of the upper wall 121, as shown in FIG. 3 and supply power to the metrology tool 40a. The data connectors 13/353 and the power connectors 14/354 may vary widely. For example, they may be configured to provide one or more data (or power) transmitting functions including USB, USB 2.0, Ethernet, and the like.

In some embodiments, the interface device 35 further includes a processor 352, a transceiver 357, and a code reader 356. In addition, the wafer carrier 10 further includes a carrier identification 16, such as a RFID tag. The carrier identification 16 wirelessly transmits signals with various information on the wafer carrier 10 to the code reader 356, including, but not limited to, the identity of the wafer 5 contained in the wafer carrier 10.

The code reader 356 then outputs the data of the wafer carrier 10 to an input of the processor 352. The processor 352 performs further processing on the data from the code reader 356 and the transceiver 351 and outputs the processed data to the transceiver 357 for data transmission to the FDC system 50 or the control system 60 via an antenna 358. For example, the processor 352 matches the carrier identity from the carrier identification 16 with the metrology data from the metrology system 40, so that the FDC system 50 can reorganize the metrology data is sent from which wafer carrier 10. Therefore, the information of the wafer carrier 10 including the environmental conditions within the wafer carrier 10 can be processed by the FDC system 50 or the control system 60.

Back to FIG. 1 again, the FDC system 50 evaluates conditions in the wafer carrier 10 to detect abnormalities or faults, such as humidity change in the wafer carrier 10, by monitoring the data associated the environmental conditions in the wafer carrier 10 before, during, and after the transportation process. In one example, an abnormality is indicated when the level of gas concentration of the wafer carrier 10 varies (higher or lower) significantly from the expected level of gas concentration determined, for example, by archival data stored in the archive database 70 or archival data transmitted from the carrier identification 16. Such abnormalities may indicate that there is a fault with the wafer 5. For example, damage to the wafer carrier 10 may cause the gas concentration within the wafer carrier 10 to vary from the expected gas concentration.

The FDC system 50 also evaluates conditions around the wafer carrier 10 to detect abnormalities or faults, such as humidity change in the vicinity of the wafer carrier 10, by monitoring the data associated the environmental conditions around the wafer carrier 10 before, during, and after the transportation process. In one example, an abnormality is indicated when the humidity around the wafer carrier 10 varies (higher or lower) significantly from the expected humidity determined, for example, by archival data stored in the archive database 70 or archival data transmitted from the carrier identification 16. Such abnormalities may indicate that there is a fault with the first and second processing tools 31 and 32. For example, a leakage of chemical solution outside of the first and second processing tools 31 and 32 may cause the humidity of the fabrication system 30 to vary from the expected humidity.

In some embodiments, the FDC system 50 implements statistical process control (SPC) to track and analyze the condition of the wafer carrier 10. For example, the FDC system 50 may implement SPC charts that document historical data of the wafer carrier 10 by charting SPC data associated with the process over time. Such SPC data includes parameters associated with the location of the wafer carrier 10. When the SPC data indicates that parameters have departed from a range of acceptable values (in other words, when the FDC system 50 detects a fault or abnormality), the FDC system 50 triggers a warning to the control system 60 and/or notifies an engineer or operator of the fabrication system 30, so that any fault with the wafer carrier 10 may be identified and remedied.

The control system 60 can implement control actions in real time, wafer-to-wafer, lot-to-lot, or a combination thereof. In the depicted embodiments, the control system 60 implements control actions to control the operation status of the fabrication system 30. For example, the control system 60 (based on a warning from the FDC system 50) shuts down the operation of the first processing tool 31 so as to stop the process being performed in the first processing tool 31. In some other embodiments, the control system 60 implements control actions to actuate the transportation apparatus 36 to move the wafer carrier 10 to the rework station 34 to remove a material layer formed on the wafer 5.

In some other embodiments, the control system 60 implements control actions to modify process parameter performed by the first processing tool 31 and/or the second processing tool 32. For example, the control system 60 (based on inline metrology data from the metrology system 40) modifies the predetermined process parameter (specifically, the parameters implemented by the first processing tool 31 and/or the second processing tool 32, such as process time, flow rate of gas, chamber pressure, chamber temperature, wafer temperature, or other process parameters) for each wafer to ensure that each wafer located in the first processing tool 31 and/or the second processing tool 32 exhibits the targeted characteristics.

The archive database 70 may include a number of storage devices to provide information storage. The information may include raw data obtained directly from the metrology system 40, as well as information from the fabrication system 30. For example, the information from the metrology system 40 may be transferred to the archive database 70 and stored in the archive database 70 for archival purposes. The data from the metrology system 40 may be stored in its original form (e.g., as it was obtained from the metrology system 40 or the fabrication system 30) and it may be stored in its processed form (e.g., converted to a digital signal from an analog signal). The archive database 70 stores data associated with the fabrication facility 1, and particularly data associated with the environmental conditions in the wafer carrier 10 and around the wafer carrier 10.

In the depicted embodiment, the archive database 70 stores data collected from the fabrication system 30, the metrology system 40, the FDC system 50, the control system 60, another entity 80, or a combination thereof. For example, the archive database 70 stores data associated with wafer characteristics of wafers processed by the fabrication system 30 (such as that collected by the metrology system 40 as described below), data associated with parameters implemented by the fabrication system 30 to process such wafers, data associated with analysis of the wafer characteristics and/or parameters of the FDC system 50 and the control system 60, and other data associated with the fabrication facility 1. In one example, the fabrication system 30, the metrology system 40, the FDC system 50, the control system 60, and the other entity 80 may each have an associated database.

Figure 5:
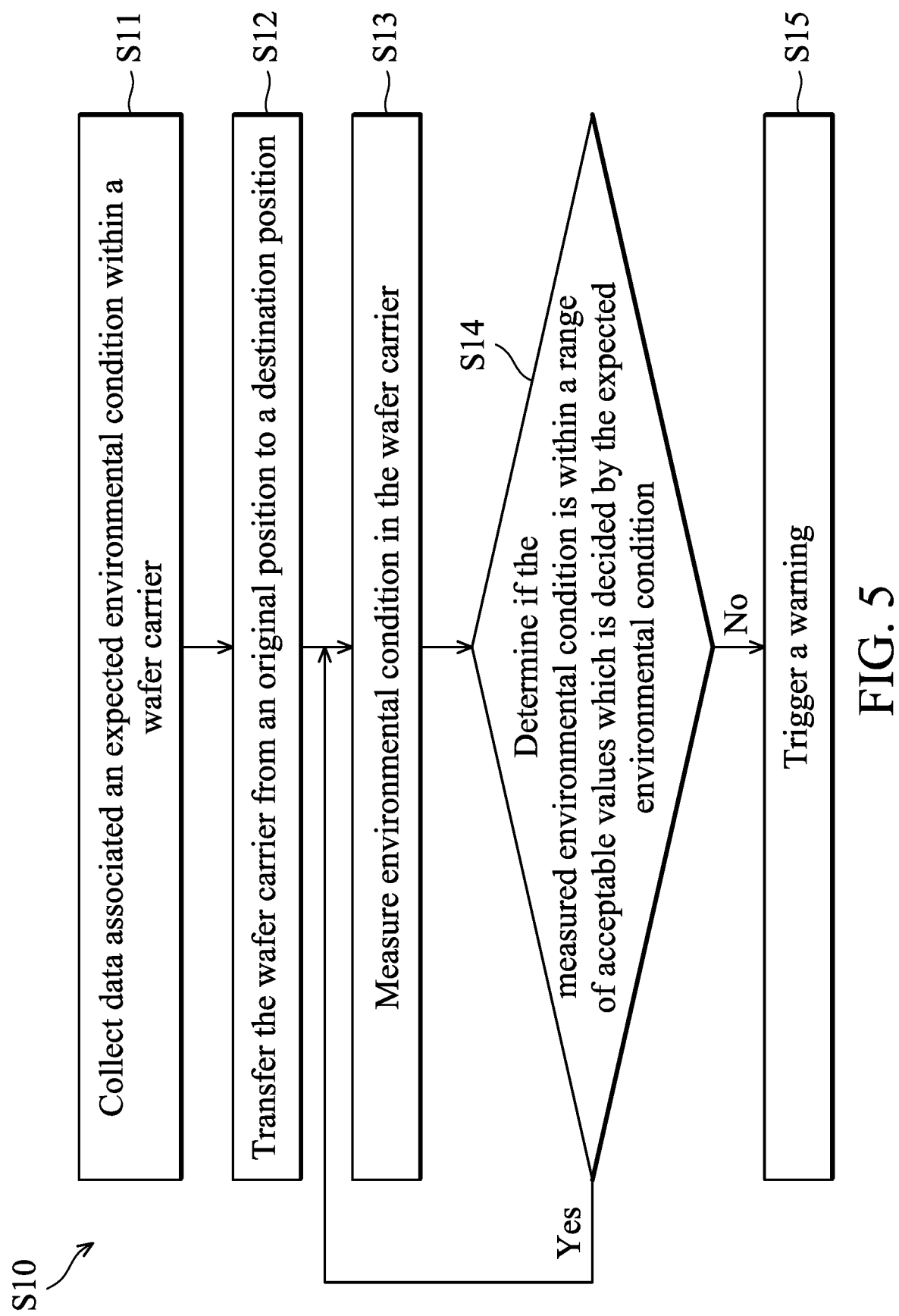
FIG. 5 is a flowchart of a method of enabling fault detection in a wafer carrier, in accordance with some embodiments.

FIG. 5 is a simplified flowchart of a method S10 of enabling fault detection within the wafer carrier 10, in accordance with some embodiments. For illustration, the flow chart will be described along with the drawings shown in FIGS. 1-4. Some of the described stages can be replaced or eliminated in different embodiments.

The method S10 includes operation S11, in which data associated with the expected environmental conditions in the wafer carrier 10 containing one or more wafers 5 is collected. The data associated with the expected environmental conditions in the wafer carrier 10 may be in the form of a range of values within which it has been observed that normal conditions in the wafer carrier 10 consistently occur.

In some embodiments, the data is retrieved from the archive database 70 and sent to the FDC system 50. In some other embodiments, the data is collected by the interface device 35 which transmits the data read from the carrier identification 16 to the FDC system 50. In some other embodiments, the data is applied to the FDC system 50 by engineering or processing knowledge.

In some embodiments, the data associated with the expected environmental conditions in the wafer carrier 10 is determined by a component of the material layer formed on the wafer 5. For example, the material layer formed on the wafer 5 includes a metal layer. While the wafer 5 is stored in the wafer carrier 10, the level of gas concentration (such as oxygen concentration) is expected to stay within a range of values so as to make sure the condition of the metal layer is acceptable. Since different components of the material layer require different storage conditions, the data associated with the expected level of gas concentration may vary according to the components of the material layer.

The method S10 also includes operation S12, in which the wafer carrier 10 is transferred from an original position to a destination position. In some embodiments, the wafer carrier 10 is moved by the transportation apparatus 36 from the first processing tool 31 to the second processing tool 32, after a material layer is formed by the first processing tool 31 over the wafers 5 that are contained in the wafer carrier 10. In some embodiments, the wafer carrier 10 is moved by the transportation apparatus 36 between the stocker 33 and the first processing tool 31. In some other embodiments, the wafer carrier 10 is moved between the load port 332 of the stocker 33 and one of the shelves 331 of the stocker 33. The movement of the wafer carrier may be controlled by the control system 60.

The method S10 also includes operation S13, in which environmental conditions in the wafer carrier 10 are measured by the metrology system 40. In some embodiments, the environmental conditions in the wafer carrier 10 are measured during the transfer of the wafer 5. For example, the measurement of the environmental conditions in the wafer carrier 10 is initiated once the wafer carrier 10 is removed from the load port 311 of the first processing tool 31, and the measurement of the environmental conditions in the wafer carrier 10 is terminated once the wafer carrier 10 is positioned on the load port 321 of the second processing tool 32.

In some embodiments, the measurement of the environmental conditions in the wafer carrier 10 is executed periodically when the wafer carrier 10 is coupled to the interface devices 35 in the fabrication system 30. For example, during the movement of the wafer carrier 10 from the shelf 331 to the load port 332 of the stocker 33, the metrology system 40 will not start monitoring the environmental conditions in the wafer carrier 10 until the wafer carrier 10 is placed on the load port 332. In addition, during the stay of the wafer carrier 10 on the shelf 331, the measurement of the environmental conditions in the wafer carrier 10 is executed multiple times at regular time intervals. The detected data associated with the environmental conditions in the wafer carrier 10 is transmitted in real time to the FDC system 50 via the interface devices 35.

However, it should be appreciated that many variations and modifications can be made to embodiments of the disclosure. The measurement of the environmental conditions in the wafer carrier 10 may be executed continuously no matter whether the wafer carrier 10 is engaged with the interface devices 35 or not. The detected data associated with the environmental conditions in the wafer carrier 10 is stored in the storage device 46 of the metrology system 40 and sent to the FDC system 50 when the wafer carrier 10 is coupled to one of the interface devices 35. Alternatively, the detected data associated with the environmental conditions in the wafer carrier 10 is transmitted to the FDC system 50 in real time through wireless connections.

In some embodiments, the measurement of the environmental conditions in the wafer carrier 10 is executed even during the removal of the wafer 5. For example, once the wafer carrier 10 is placed on the load port 311 of the first processing tool 31, the wafer 5 is removed from the wafer carrier 10 by a robot arm (not shown in figures) and moved to an interface module in the first processing tool 31. At this time, since the interior (such as the enclosure 110) of the wafer carrier 10 communicates with the interior of the first processing tool 31, the metrology system 40 can be used to detect environmental conditions in the first processing tool 31.

Figure 6:
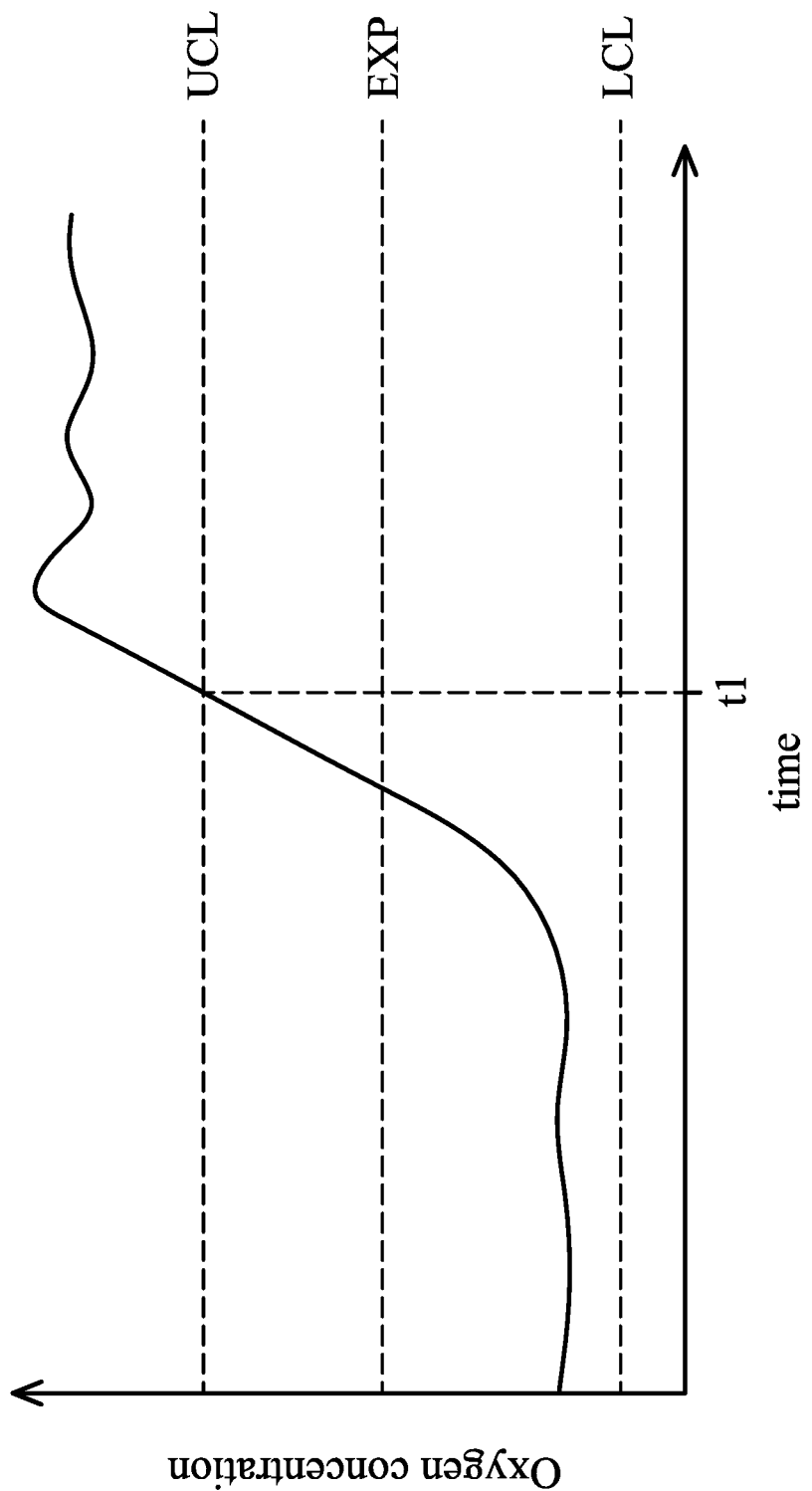
FIG. 6 is a diagram plotting measured humidity in a wafer carrier versus time of storing a wafer in the wafer carrier, upper control limits and lower control limits, in accordance with some embodiments.

The method S10 also includes operation S14, in which the data associated with the measured environmental conditions produced in operation S13 is compared with data associated with the expected environmental conditions collected in operation S11. In some embodiments, the measured environmental conditions obtained in operation S13 is compiled in a time-series chart (T-chart) as shown in FIG. 6, and the T-chart is analyzed by the FDC system 50.

In some embodiments, before analyzing the T-chart, a range of acceptable values for the measured environmental conditions is determined. The range of acceptable values for the measured environmental conditions may be a standard deviation from an expected value. For example, as shown in FIG. 6, an upper control limit (UCL) is set at the expected oxygen concentration (EXP) plus one standard deviation of the oxygen concentration, and lower control limits (LCL) are set at the expected oxygen concentration (EXP) minus one standard deviation of the oxygen concentration. The difference between the UCL and LCL at a specific time is referred to as the range of acceptable values. In some embodiments, the range of acceptable values is determined by the material layer formed on the wafers 5 that are stored in the wafer carrier 10.

Alternatively, the range of acceptable values for the measured environmental conditions may be a specific ratio of the expected environmental conditions in each process event. For example, UCL are set at the expected level of oxygen concentration plus about 2% of the level of oxygen concentration, and LCL are set at the expected level of oxygen concentration minus about 2% of the level of gas concentration. The difference between the UCL and LCL at a specific time is referred to as the range of acceptable values.

After the range of acceptable values for the measured environmental conditions is determined, the FDC system 50 analyzes the measured environmental conditions to determine if the measured environmental conditions are within the acceptable range.

After the analysis, if the measured environmental conditions are within the range of acceptable values, the method repeats operation S13 and S14 until the predetermined period for monitoring the wafer carrier 10 is finished, for example, until the operation S12 is finished. However, if the measured environmental conditions exceed the range of acceptable values, the method continues with operation S15, in which an alarm condition is indicated. For example, as shown in FIG. 6, at time t1, the measured level of oxygen concentration is higher than the UCL. Namely, the measured level of oxygen concentration is outside the range of acceptable values, and a warning is issued at time t1.

In some embodiments, when the data processed by the FDC system 50 indicates that the measured environmental conditions has departed from the expected environmental conditions (in other words, when the FDC system 50 detects a fault or abnormality), the FDC system 50 triggers an alarm. In some embodiments, out-of-specification data indicates a fault (or abnormality) in the wafer carrier 10, such as exposure of the wafer 5 to the outside of the wafer carrier 10 or a generation of outgassing in the wafer carrier 10.

The exposure of the wafer to the outside of the wafer carrier 10 or generation of outgassing in the wafer carrier 10 may damage the material layer formed on the wafer 5. If additional material layers are formed on the damaged material layer, it will not only cause excessive wafer scrap but also a waste of manufacturing resources. To prevent this from happening, the FDC system 50 triggers an alarm and notifies the control system 60 to move the wafer carrier 10 along with the wafer 5 to the rework station 34 (FIG. 2) for removing the material layer, so that the wafer 5 can be sent to the first processing tool 31 at which a new material layer is formed on the wafer 5.

When the wafer 5 is processed in the rework station 34, any suitable process may be performed on the wafer 5 so as to remove the material layer formed on the wafer 5. For example, an etching process is performed over the wafer 5, so as to remove the material layer by plasma. Alternatively, a cleaning process is performed over the wafer 5, so as to remove the material layer using a cleaning liquid.

Afterwards, the wafer carrier 10 along with the wafer 5, which has been reworked, are moved to the first processing tool 31 for forming another new material layer, or to the stocker 33 for storage. During the movement of the wafer 5, the environmental conditions in the wafer carrier 10 are also detected using the method S10 described above.

Figure 7:
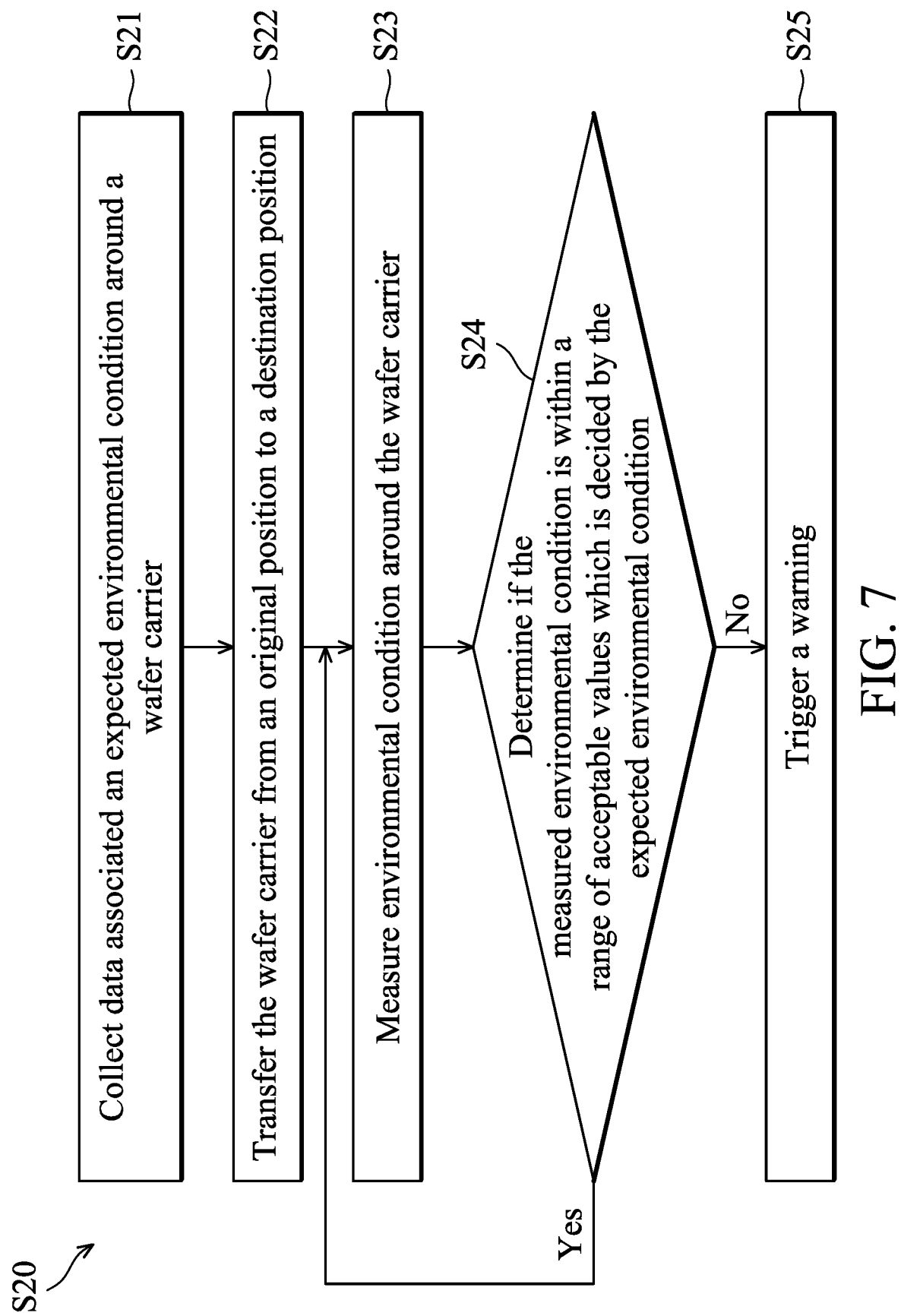
FIG. 7 is a flowchart of a method of enabling fault detection around a wafer carrier, in accordance with some embodiments.

FIG. 7 is a simplified flowchart of a method S20 of enabling fault detection around the wafer carrier 10, in accordance with some embodiments. For illustration, the flow chart will be described along with the drawings shown in FIGS. 2 and 8. Some of the described stages can be replaced or eliminated in different embodiments.

The method S20 includes operation S21, in which data associated with the environment conditions around the wafer carrier 10 is collected. In some embodiments, data associated with environment conditions at selected locations in the fabrication system 30 is produced by the metrology tool 40b and is sent to the archive database 70.

In some embodiments, the data associated with environment conditions is collected at selected locations while the wafer carrier 10 is transported by the transportation apparatus 36 from one location to another location in the fabrication facility 1. Specifically, data associated with environment conditions is measured at locations P10 and P20 (FIG. 2) where the first process tool 31 and the second processing tool 32 are located. The measurement may be respectively executed while the wafer carrier 10 is unloaded from the first process tool 31 and while the wafer carrier 10 is loaded on the second processing tool 32.

Alternatively or additionally, the data associated with environment conditions is measured multiple times during the transportation from locations P10 to location P20 at regular time intervals, such as every 0.5 seconds (2 points/sec), and the data associated with environment conditions at each measured time interval are recorded separately in the archive database 70. In this case, since the location of the metrology tool 40b is changed with time, the environment conditions correlated with location in the fabrication system 30 is measured and recorded. The data is stored in the archive database 70. One example for the data associated with one of the environment conditions, such as humidity, in each location is illustrated in table 1.1 below:

TABLE 1.1

| No. | EVENT NAME | EVENT TIME | HUMIDITY | LOCATION |
|---|---|---|---|---|
| 1 | (a) Lift carrier | 00:00:00 | 15 | P10 |
| 2 | (b) Transfer | 00:01:20 | 15 | P20 |
| 3 | (c) Transfer | 00:01:40 | 15 | P30 |
| 4 | (d) Lower carrier | 00:02:00 | 15 | P40 |

The table 1.1 includes four columns, where the columns include a data number column, an event name column, a humidity column and a location column. The humidity column may record an amount of moisture in the location where the metrology tool 40b is located. The humidity column may record an amount of moisture at the event time. The location column may record the location of the metrology tool 40b in the fabrication facility 1.

The operation S21 may be repeated many times, as long as no fault is found in the fabrication facility 1 (such as no chemical leakage). Afterwards, data associated with the environment conditions around the wafer carrier 10 detected at the selected locations is stored in the archive database 70. The data may be processed further before being stored in the archive database 70. For example, the mean value of humidity measured at a specific location of the last five measurements is calculated and stored in the archive database 70. Additionally, the standard deviation of humidity measured at a specific location of the last five measurements is calculated and stored in the archive database 70. As a result, a big data pattern is stored in the archive database 70.

However, it should be appreciated that many variations and modifications can be made to embodiments of the disclosure. In some embodiments, operation S21 is omitted. The values of humidity in table 1.1 are applied into the archive database 70 by engineering/process knowledge. For example, when it has been observed that a normal condition in the fabrication facility 1 consistently occurs at a specific humidity, such humidity is established as normal humidity and is applied into the archive database 70.

The method S20 also includes operation S22, in which the wafer carrier 10 is transferred from an original position to a destination position. In some embodiments, the wafer carrier 10 is moved by the transportation apparatus 36 from the first processing tool 31 to the second processing tool 32, after a material layer is formed by the first processing tool 31 over the wafers 5 that are contained in the wafer carrier 10. In some embodiments, the wafer carrier 10 is moved by the transportation apparatus 36 between the stocker 33 and the first processing tool 31. In some other embodiments, the wafer carrier 10 is moved between the load port 332 of the stocker 33 and one of the shelves 331 of the stocker 33. The movement of the wafer carrier 10 may be controlled by the control system 60.

The method S20 also includes operation S23, in which environmental conditions around the wafer carrier 10 are measured by the metrology tool 40b. In some embodiments, at least one of the measurements in operation S23 corresponds to one of the measurements in operation S21. For example, the measurements in operation S23 occur at the same location with the measurements in operation S21. In some embodiments, the number of measurements in operation S23 is the same as the number of measurements in operation S21. Alternatively, there are fewer measurements in operation S23 than there are in operation S21.

The method S20 also includes operation S24, in which the environmental conditions measured in operation S23 are compared with an expected environmental conditions stored in the archive database 70. In some embodiments, data associated with the expected environmental conditions at different locations are derived from archive database 70 to the FDC system 50. Since the data associated with the expected environmental conditions from the archive database 70 represent normal humidity of the fabrication facility 1, this data is also referred to as "expected environmental conditions". While at the same time, the data associated with the environmental conditions obtained in operation S23 is transmitted from the metrology system 40 to the FDC system 50 via the interface device 35.

Figure 8A:
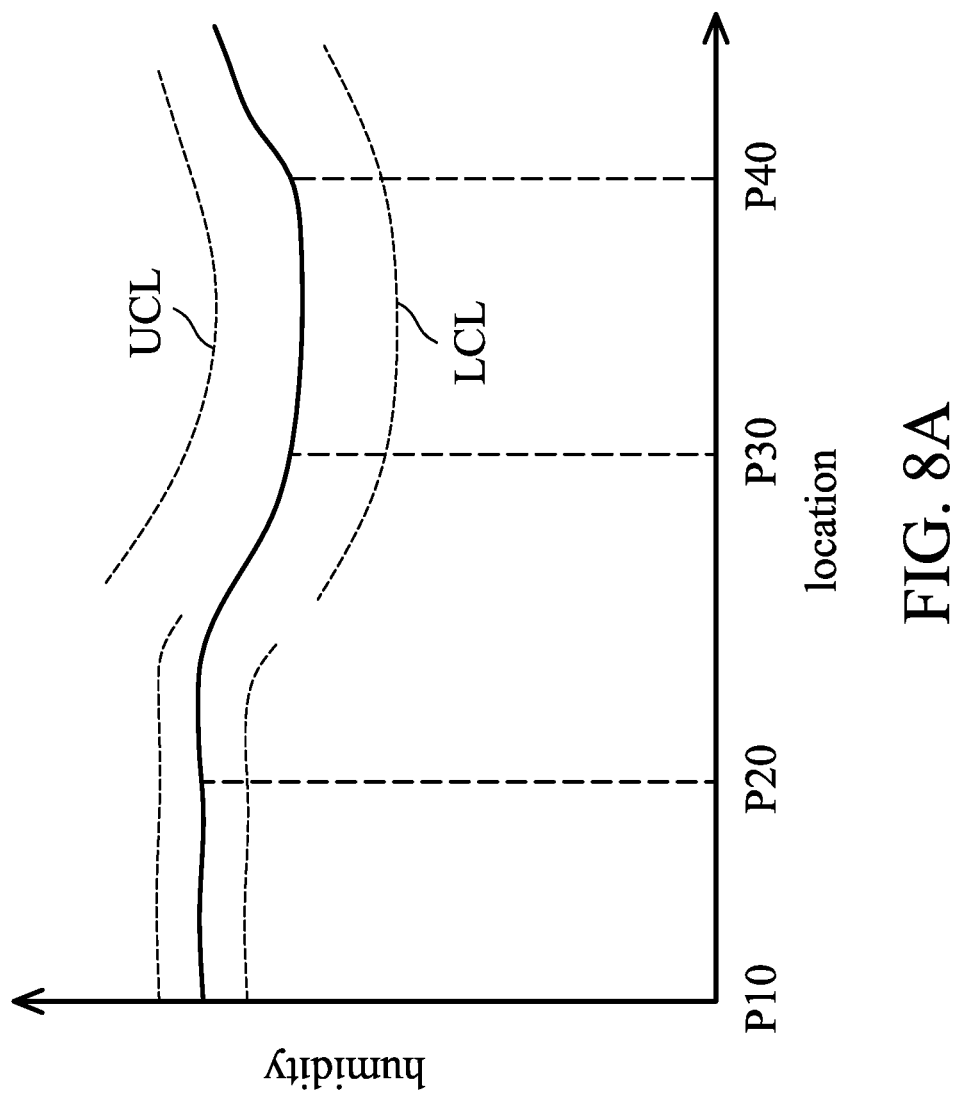
FIG. 8A is a diagram plotting expected humidity in a fabrication system versus locations, in accordance with some embodiments.
Figure 8B:
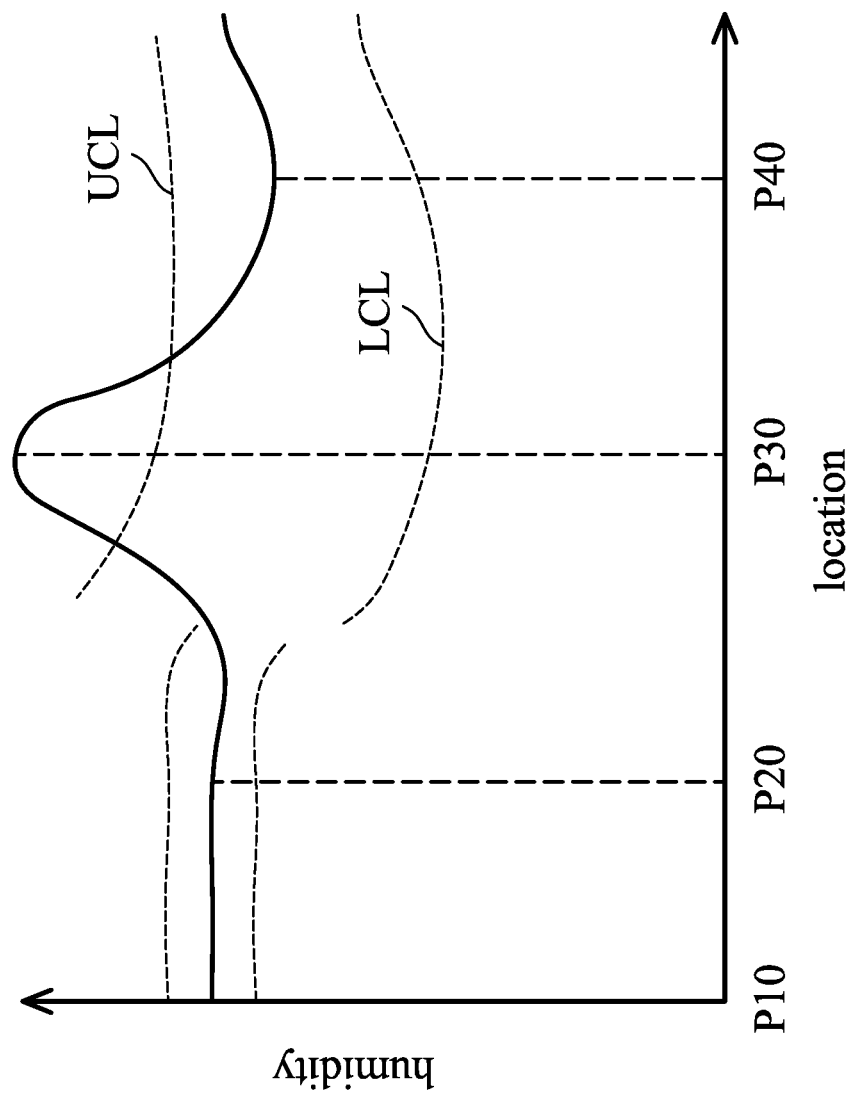
FIG. 8B is a diagram plotting humidity measurement in a fabrication system versus locations, in accordance with some embodiments.

In some embodiments, the data associated with the expected environmental conditions is compiled in time-series chart (T-chart) as shown in FIG. 8A, and the data associated with the measured environmental conditions obtained in operation S23 is compiled in time-series chart (T-chart) as shown in FIG. 8B.

In some embodiments, before analyzing the T-chart shown in FIG. 8B, a range of acceptable values for the difference between the expected environmental conditions measurement and the measured environmental conditions at each selected location is determined. The range of acceptable values for the difference may be a standard deviation of the expected environmental conditions at each location. For example, as shown in FIG. 8A, upper control limits (UCL) are set at the expected humidity plus one standard deviation of the expected humidity, and lower control limits (LCL) are set at the expected humidity subtract one standard deviation of the expected humidity. The difference between the UCL and LCL at a specific time is referred to as the range of acceptable values.

Alternatively, the range of acceptable values for the difference may be a specific ratio of the expected environmental conditions at each selected location. For example, UCL are set at the expected humidity plus about 2% of the expected humidity, and LCL are set at the expected humidity subtract about 2% of the expected humidity. The difference between the UCL and LCL at a specific time is referred to as the range of acceptable values.

In some embodiments, the range of acceptable values for the difference at two locations may be different. For example, as shown in FIG. 8A, the range of acceptable values for the difference at location P10 is smaller than the range of acceptable values for the difference at location P30 because humidity at location P30 may be changed by a variety of factors. However, it should be appreciated that many variations and modifications can be made to embodiments of the disclosure. The range of acceptable values for the difference in all locations may be the same.

After the range of acceptable values for the difference between the measured environmental conditions and the expected environmental conditions is determined, the FDC system 50 compares the measured environmental conditions at a selected location and the expected environmental conditions corresponding to the same location to determine if the difference there between is within the range of acceptable values.

After the comparison, if the difference between the measured environmental conditions and the expected environmental conditions is within the range of acceptable value, the method repeats operations S23 and S24. However, if the difference between the measured environmental conditions and the expected environmental conditions exceeds the range of acceptable values, the method continues with operation S25, in which a warning is triggered.

In some embodiments, when the data processed by the FDC system 50 indicates that the measured environmental conditions have departed from expected environmental conditions (in other words, when the FDC system 50 detects a fault or abnormality), the FDC system 50 triggers an alarm. In some embodiments, out of specification data exhibits behavior that indicates a fault (or abnormality) in the fabrication system 30. In the present example, statistically analyzed parameter data is out of specification when it exhibits behavior associated with a chemical leak (such as gas or liquid) of one of the processing tool that is positioned in the vicinity of the wafer carrier 10.

It has been observed that leakage of a chemical, including liquid solution, volatile gas, etc., will cause an increase in humidity in the fabrication system 30. Therefore, to protect the fabrication system 30 or the wafer 5 from damage, the FDC system 50 notifies an operator and indicates the location where the fault has occurred so that any issues with the fabrication system 30 may be identified and remedied.

On the other hand, the FDC system 50 may optionally halt the process performed by the first and second processing tools 31 and 32 located around the wafer carrier 10. For example, when the FDC system 50 indicates that a fault has occurred at a location P11 between locations P10 and P20 where the first and second processing tools 31 and 32 are situated, the FDC system 50 halts the process performed by the first and second processing tools 31 and 32 to prevent wafer scrap from happening in the first and second processing tools 31 and 32.

Figure 9:
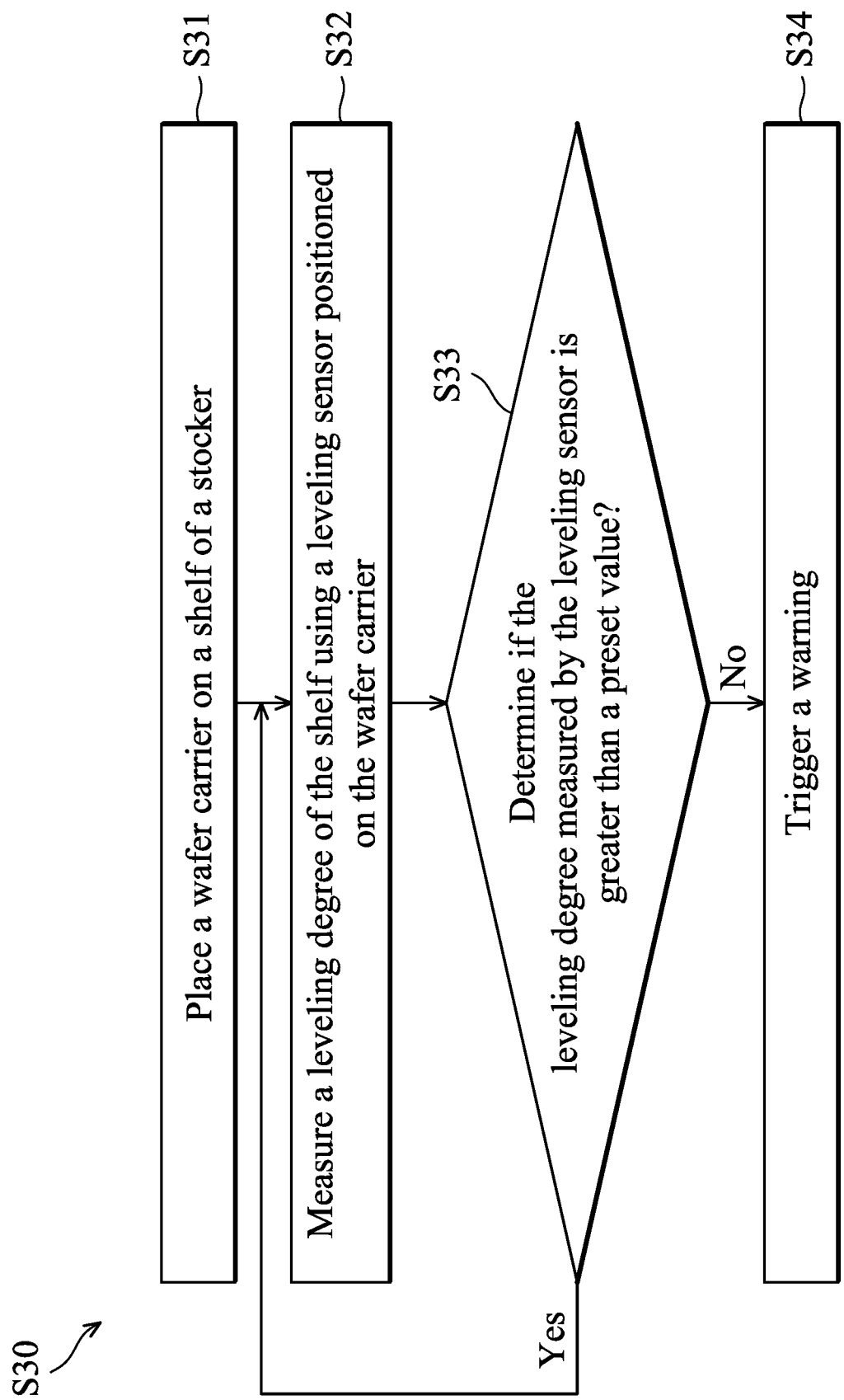
FIG. 9 is a flowchart of a method of enabling fault detection in a stocker, in accordance with some embodiments.

FIG. 9 is a simplified flowchart of a method S30 of enabling fault detection in the fabrication facility 1, in accordance with some embodiments. For illustration, the flow chart will be described along with the drawings shown in FIG. 10. Some of the described stages can be replaced or eliminated in different embodiments.

Figure 10:
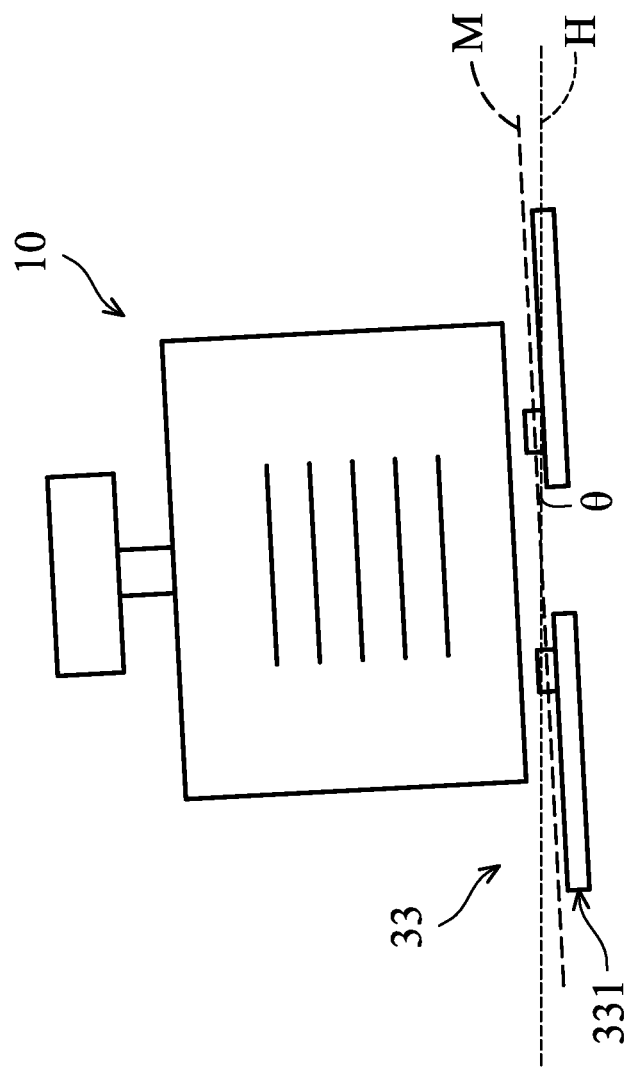
FIG. 10 is a schematic view of a shelf of a stocker in an abnormal condition, in accordance with some embodiments.

The method S30 includes operation S31, in which the wafer carrier 10 is placed on the one of the shelves 331 of the stocker 33, as shown in FIG. 10. The method S30 further includes operation S32, in which a leveling degree of the one of the shelves 331 is measured with the metrology tool 40c which includes a leveling sensor 43 (FIG. 4). For example, as shown in FIG. 10, the metrology tool 40c measures the wafer carrier 10 which is placed on a plane M. The plane M forms an angle θ relative to a horizontal plane H. The angle θ is the leveling degree of the wafer carrier 10. The method S30 also includes operation S33, in which the leveling degree detected by the leveling sensor 43 is compared with a preset value. The preset value may be in a range of about 2 degrees to about 5 degrees.

Too large a leveling degree may indicate that one of the shelves 331 has been tilted. To prevent the wafer carrier 10 from being dropped, the method S30 continues to operation S34, in which the FDC system 50 triggers a warning and notifies the control system 60 to remove the wafer carrier 10 from one of the shelves 331, so that damage to the wafer carrier 10 and the wafer 5 contained in the wafer carrier 10 can be prevented.

Embodiments of method and device for fault detection in a fabrication facility are provided. Data associated with the environmental conditions in or around the wafer carrier are detected and analyzed to determine whether an abnormal condition is generated in the wafer carrier. When an abnormal situation occurs, the control system will undertake an immediate response and handle it properly. Therefore, damage to the fabrication tool for processing semiconductor wafers can be mitigated or avoided and wafer scarp is reduced.

In accordance with some embodiments, a method for fault detection in a fabrication facility is provided. The method includes moving a wafer carrier using a transferring apparatus. The method further includes measuring an environmental condition within the wafer carrier or around the wafer carrier using a metrology tool positioned on the wafer carrier during the movement of the wafer carrier. The method also includes issuing a warning when the detected environmental condition is outside a range of acceptable values.

In accordance with some embodiments, a method for processing a wafer is provided. The method includes forming a material layer over a wafer in a first processing tool. The method further includes loading the wafer formed with the material layer into a wafer carrier. The method also includes moving a wafer carrier containing the wafer from the first processing tool to a second processing tool and monitoring an environmental condition within the wafer carrier. In addition, the method includes stopping the movement of the wafer carrier from the first processing tool to the second processing tool and transferring the wafer carrier to a rework station for removing the material layer, when the environmental condition measured by the metrology tool is outside a range of acceptable values.

In accordance with some embodiments, a fabrication facility is provided. The fabrication facility includes a wafer carrier configured to receive at least one wafer. The fabrication facility further includes a transferring apparatus configured to move the wafer carrier. The fabrication facility also includes a metrology tool positioned on the wafer carrier and configured to measure an environmental condition within the wafer carrier or in the vicinity of the wafer carrier. In addition, the fabrication facility includes a control system. The control system is configured to control an operation of the transferring apparatus to move the wafer carrier to a rework station for removing a material layer over the wafer when the environmental condition measured by the metrology tool is outside a range of acceptable values.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for fault detection in a fabrication facility, comprising:
    moving a wafer carrier using a transportation apparatus, wherein the transportation apparatus moves the wafer carrier along a predetermined path multiple times;
    collecting data associated with an environmental condition within the wafer carrier or around the wafer carrier using a metrology tool positioned on the wafer carrier on the predetermined path in a previous movement of the transportation apparatus;
    storing data associated with the environmental condition in the previous movement of the transportation apparatus in an archive database;
    measuring the environmental condition within the wafer carrier or around the wafer carrier using the metrology tool during the movement of the wafer carrier; and
    issuing a warning when the measured environmental condition is outside a range of acceptable values, wherein the range of acceptable values is derived from the archive database.

2. The method as claimed in claim 1, wherein when the warning is issued according to the environmental condition measured within the wafer carrier and when a wafer is positioned in the wafer carrier, the method further comprises:
    transferring the wafer carrier to a rework station; unloading the wafer from the wafer carrier to the rework station; and removing a material layer over the wafer.

3. The method as claimed in claim 1, wherein when the warning is issued according to the environmental condition measured around the wafer carrier, the method further comprises:
    stopping an operation of a fabrication tool.

4. The method as claimed in claim 1, wherein the range of acceptable values is determined by a location where the wafer carrier is located.

5. The method as claimed in claim 1, further comprising: transmitting a data associated with the environmental condition to a fault detection and classification system via an interface device that is positioned at the transportation apparatus.

6. The method as claimed in claim 1, further comprising:
    placing the wafer carrier on a load port of a processing tool; and
    transmitting a data associated with the environmental condition to a fault detection and classification system via an interface device that is positioned at the load port.

7. The method as claimed in claim 1, further comprising:
    storing the wafer carrier which contains a wafer in a stocker;
    measuring the environmental condition within the wafer carrier or around the wafer carrier using the metrology tool positioned on the wafer carrier during a storage of the wafer carrier; and
    transmitting a data associated with the environmental condition to a fault detection and classification system via an interface device that is positioned at the stocker.

8. The method as claimed in claim 1, further comprising:
    placing the wafer carrier on a shelf of a stocker;
    measuring a leveling degree of the shelf; and
    indicating an abnormality of the stocker when the leveling degree is greater than a preset angle.

9. The method as claimed in claim 1, wherein the environmental condition comprises at least one of temperature, humidity, air pressure, a level of particle concentration, a level of gas concentration, or a level of metal ion concentration.

10. A method for processing a wafer, comprising:
    forming a material layer over a wafer in a first processing tool;
    loading the wafer formed with the material layer into a wafer carrier;
    moving the wafer carrier containing the wafer from the first processing tool to a second processing tool and monitoring an environmental condition within the wafer carrier, wherein the movement of the wafer carrier containing the wafer from the first processing tool to the second processing tool is executed multiple times;

storing data associated with the environmental condition in an archive database in the previous movement of the wafer carrier; and stopping the movement of the wafer carrier from the first processing tool to the second processing tool and transferring the wafer carrier to a rework station for removing the material layer, when the environmental condition monitored by a metrology tool is outside a range of acceptable values, wherein the range of acceptable values is derived from the archive database.

11. The method as claimed in claim 10, wherein the range of acceptable values is determined by a component of the material layer.

12. The method as claimed in claim 10, wherein the wafer carrier is moved by a transportation apparatus, and the method further comprises:

transmitting a data associated with the environmental condition to a fault detection and classification system via an interface device that is positioned at the transportation apparatus.

13. The method as claimed in claim 10, further comprising:

placing the wafer carrier on a load port of the first processing tool; and transmitting a data associated with the environmental condition to a fault detection and classification system via an interface device that is positioned at the load port.

14. The method as claimed in claim 10, further comprising:

placing the wafer carrier on a load port of the first processing tool;

measuring a leveling degree of the load port; and indicating an abnormality of the load port when the leaving degree is outside an acceptable range.

15. The method as claimed in claim 10, wherein the environmental condition comprises temperature, humidity, air pressure, a level of particle concentration, a level of gas concentration, and a level of metal ion concentration.

16. A fabrication facility, comprising:

a wafer carrier configured to receive at least one wafer;

a processing tool having a load port configured to dock the wafer carrier;

a transportation apparatus configured to move the wafer carrier to the load port, wherein the transportation apparatus includes a trail assembly and an overhead hoist transport assembly movably suspend on the trail assembly;

a metrology tool positioned on the wafer carrier, wherein the metrology tool includes at least one sensor configured to:

measure an environmental condition within the wafer carrier or in a vicinity of the wafer carrier; and measure a leveling degree of the load port when the wafer carrier is placed on the load port of the processing tool; and an interface device positioned in the transportation apparatus, wherein the interface device includes a power circuit configured to supply power to the metrology tool.

17. The fabrication facility as claimed in claim 16, wherein the interface device further includes an antenna configured to transmit a data associated with the environmental condition from the metrology tool to a fault detection and classification system for analysis.

18. The fabrication facility as claimed in claim 16, wherein the metrology tool is positioned on an inner surface or an outer surface of the wafer carrier.

19. The fabrication facility as claimed in claim 16, further comprising a stocker configured for storage of the wafer carrier, wherein the transportation apparatus is configured to move the wafer carrier between the load port of the processing tool and a load port of the stocker, wherein the metrology tool is further configured to measure a leveling degree of the load port of the stocker when the wafer carrier is placed on the load port of the stocker.

20. The fabrication facility as claimed in claim 16, wherein the environmental condition comprises temperature, humidity, air pressure, a level of particle concentration, a level of gas concentration, and a level of metal ion concentration.

* * * * *